(12) United States Patent
Bright et al.

(10) Patent No.: US 7,397,709 B2
(45) Date of Patent: Jul. 8, 2008

(54) METHOD AND APPARATUS FOR IN-SYSTEM REDUNDANT ARRAY REPAIR ON INTEGRATED CIRCUITS

(75) Inventors: Arthur A. Bright, Croton-on-Hudson, NY (US); Paul G. Crumley, Yorktown Heights, NY (US); Marc B. Dombrowa, Bronx, NY (US); Steven M. Douskey, Rochester, MN (US); Rudolf A. Haring, Cortlandt Manor, NY (US); Steven F. Oakland, Colchester, VT (US); Michael R. Ouellette, Westford, VT (US); Scott A. Strissel, Byron, MN (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/872,088

(22) Filed: Oct. 15, 2007

(65) Prior Publication Data

US 2008/0080274 A1 Apr. 3, 2008

Related U.S. Application Data

(62) Division of application No. 11/418,052, filed on May 4, 2006, now Pat. No. 7,310,278.

(51) Int. Cl.
*G11C 7/10* (2006.01)
*G11C 29/00* (2006.01)
*G11C 17/18* (2006.01)
*H03K 19/003* (2006.01)
*G06F 11/00* (2006.01)

(52) U.S. Cl. .............. 365/189.02; 365/189.05; 365/200; 365/201; 365/225.7; 326/9; 326/10; 326/16; 714/6

(58) Field of Classification Search ............ 365/189.02, 365/189.05, 200, 201, 225.7; 326/9, 10, 326/16; 714/6
See application file for complete search history.

(56) References Cited

U.S. PATENT DOCUMENTS

| 5,659,551 | A | | 8/1997 | Huott et al. |
| 5,666,312 | A | * | 9/1997 | Robertson ............ 365/189.02 |
| 6,115,763 | A | | 9/2000 | Douskey et al. |
| 6,130,851 | A | * | 10/2000 | Ichikawa .............. 365/225.7 |
| 6,246,618 | B1 | * | 6/2001 | Yamamoto et al. ....... 365/225.7 |
| 6,577,156 | B2 | | 6/2003 | Anand et al. |
| 6,805,789 | B2 | | 10/2004 | Srinivasan et al. |
| 7,149,136 | B2 | | 12/2006 | Tanishima et al. |

(Continued)

*Primary Examiner*—Ly D Pham
(74) *Attorney, Agent, or Firm*—Daniel P. Morris, Esq.; Scully, Scott, Murphy & Presser, P.C.

(57) ABSTRACT

Disclosed is a method of repairing an integrated circuit of the type comprising of a multitude of memory arrays and a fuse box holding control data for controlling redundancy logic of the arrays. The method comprises the steps of providing the integrated circuit with a control data selector for passing the control data from the fuse box to the memory arrays; providing a source of alternate control data, external of the integrated circuit; and connecting the source of alternate control data to the control data selector. The method comprises the further step of, at a given time, passing the alternate control data from the source thereof, through the control data selector and to the memory arrays to control the redundancy logic of the memory arrays.

6 Claims, 1 Drawing Sheet

U.S. PATENT DOCUMENTS

2003/0117829 A1 6/2003 Di Ronza et al.
2003/0218231 A1 11/2003 Sani et al.
2004/0153925 A1* 8/2004 Ronza et al. ................ 714/724
2006/0274586 A1* 12/2006 Takai et al. .................. 365/200
2006/0294440 A1* 12/2006 Riley ........................... 714/710

* cited by examiner

METHOD AND APPARATUS FOR IN-SYSTEM REDUNDANT ARRAY REPAIR ON INTEGRATED CIRCUITS

CROSS REFERENCE TO RELATED APPLICATION

This application is a divisional application of copending application Ser. No. 11/418,052, filed on May 4, 2006.

This invention was made with Government support under Subcontract B517552 under prime contract W-7405-ENG-48 awarded by the Department of Energy. The Government has certain rights in this invention.

BACKGROUND OF THE INVENTION

1. Field of the Invention

This invention generally relates to integrated circuits; and more specifically, the invention relates to in-system repair of memory arrays on integrated circuits.

2. Background Art

Integrated circuits typically contain memory arrays. Memory arrays can be classified as non-redundant or redundant. Redundant arrays have spare wordlines and/or bitlines. In the event of detection of a fail in the array during manufacturing test, the redundant wordlines or bitlines can be substituted for failing wordlines or bitlines. The information that encodes the use of redundant elements for any particular memory array can be stored—for example as described in U.S. Pat. No. 6,577,156—in a set of fuses located remotely from the memory arrays themselves.

According to the procedure disclosed in U.S. Pat. No. 6,577,156, when the integrated circuit is powered-on, the fuse information is decoded and transferred to the memory arrays using a serial scan chain, thereby enabling the required redundant word and/or bitlines in the memory arrays. At the conclusion of this procedure, the memory array operates as if it were manufactured perfectly. Any subsequent memory tests are supposed to pass.

However, if the memory array develops a new failure in the field, the above-discussed procedure is not effective for fixing that fail.

SUMMARY OF THE INVENTION

An object of this invention is to provide a repair method for use if a memory array develops a new failure after having operated in a system for some length of time.

Another object of the invention is to provide a method for modifying the original redundancy information, in a system for repairing memory arrays on integrated circuits, thereby allowing unused redundancy elements to be substituted for newly failing array elements.

A further object of the present invention is to enable electrical programming in-the-field to modify the fuse-loaded contents of the pre-existing array redundancy latches of an integrated circuit.

Another object of the invention is to provide a method for repairing a memory array in case the array develops a new failure after having operated in a system for a period of time and that is compatible with the IEE1149.1 standard.

These and other objectives are attained with a method and apparatus for in-system redundant array repair on integrated circuits. The integrated circuit is of the type comprising a multitude of memory arrays and a fuse box holding control data for controlling redundancy logic of the arrays. The method comprises the steps of providing the integrated circuit with a control data selector, in series between the fuse box and the memory arrays, for passing the control data from the fuse box to the memory arrays; providing a source of alternate control data, external of the integrated circuit; and connecting the source of alternate control data to the control data selector.

The method comprises the further step of, at a given time, passing the alternate control data from the source thereof, through the control data selector and to the memory arrays to control the redundancy logic of the memory arrays, including the step of at said given time, applying a selector enable signal to the control data selector to enable said selector to pass the alternate control data to the memory arrays.

The present invention thus provides a repair method if a memory array develops a new failure after having operated in a system for some length of time. With the preferred embodiment of the invention, described in detail below, the integrated circuit may be implemented using the circuits described in the above-mentioned U.S. Pat. No. 6,577,156, and uses in-system test software and hardware with the following properties:

1. Compatibility with the IEEE1149.1 standard (IEEE Standard Test Access Port Boundary Scan Architecture);

2. Ability to run memory tests on the array or arrays in question;

3. Ability to observe the pass/fail information for the tests and arrays in question;

4. Ability to read out diagnostic information to locate any particular failed element for the tests and arrays in question.

Given the above prerequisites, the preferred embodiment of the present invention provides a method for modifying the original redundancy information (as encoded in the fuses at manufacturing test), thereby allowing hitherto unused redundancy elements to be substituted for newly failing array elements.

Further benefits and advantages of the invention will become apparent from a consideration of the following detailed description, given with reference to the accompanying drawing, which specifies and shows a preferred embodiment of the invention.

DETAILED DESCRIPTION OF THE PREFERRED EMBODIMENTS

Figure 1:
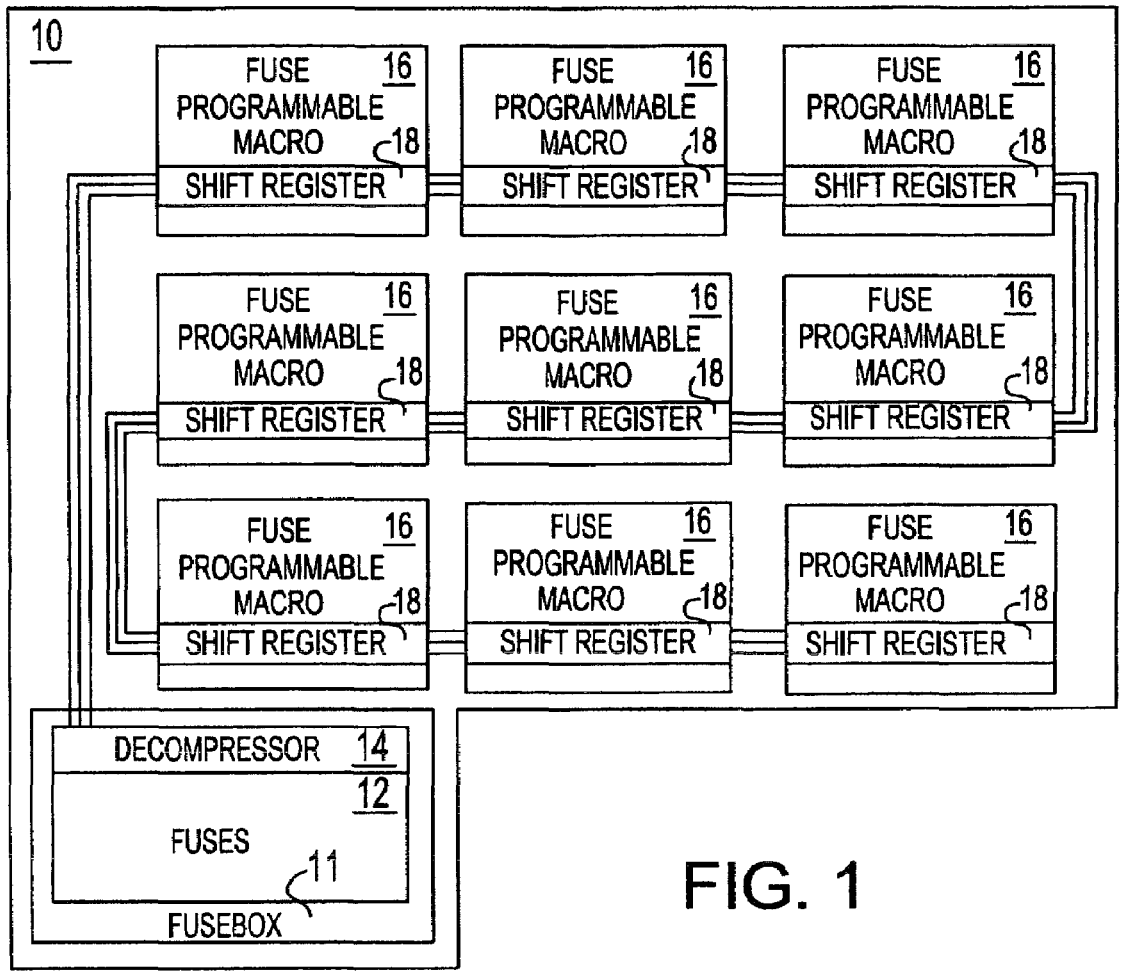
FIG. 1 is a block diagram of an integrated circuit with which the present invention may be used.

With reference now to the figures, and in particular with reference to FIG. 1, there is depicted a block diagram of an integrated circuit in accordance with a preferred embodiment of the invention. Integrated circuit 10 contains a plurality of fuse programmable macros 16. Fuse-programmable macros 16 can implement a variety of functional circuits within integrated circuit 10 and are not necessarily identical or similar in nature, but are customizable and/or repairable using fuse data retrieved from a fusebox 11. Repairable circuits include memory array macros wherein the fuse data is used to remove a memory element (e.g., a row or column) and select a redundant element to replace its function. It will be understood that replacement of memory elements can be accomplished with multiplexers and demultiplexers or a variety of other techniques well known in the art.

The present invention concerns the manner in and means by which control data for controlling the customization and/ or repair of integrated circuit 10 is accomplished. Fuses 12 are arranged in a block isolated from the fuse-programmable macros, in order to overcome the obstacles associated with placing fuses such as interference with interconnect points, inefficient use of die area due to guard rings, laser-programmable fuses or e-fuses requiring the entire layer stack for implementation, et cetera. The fuse data contains compressed information that is decompressed by decompressor 14 to produce the control data for repairing or customizing fuse-programmable macros 16. Shift registers 18 within the macros are arranged in chains to allow serial clocking of decompressed control data received from decompressor 14, so that at initialization, the control data is propagated to fuse-programmable macros 16. After initialization, the functional logic implemented by fuse-programmable macros 16 will be configured for operation of integrated circuit 10.

It should be understood that the implementation of integrated circuit 10 is not restricted to a single fusebox 11 coupled to a single chain of shift registers 18, but that the techniques of the present invention allow for a design having multiple fuseboxes coupled to multiple shift register chains. Alternatives include a single fusebox coupled to multiple shift register chains with parallel data output from the fusebox to supply each of the chains. Choice of a particular design implementation is made on the basis of macro placement within the integrated circuit, and the initialization time period that is permissible. As the number of shift registers holding control data received from fusebox 11 increases, the amount of time required to initialize integrated circuit 10 correspondingly increases. For applications wherein integrated circuit 10 is power-cycled frequently, or must initialize rapidly such as personal digital assistant (PDA) applications, it may be desirable to implement a quantity of shift register chains fed in parallel by one fusebox or individually by several fuseboxes.

Figure 2:
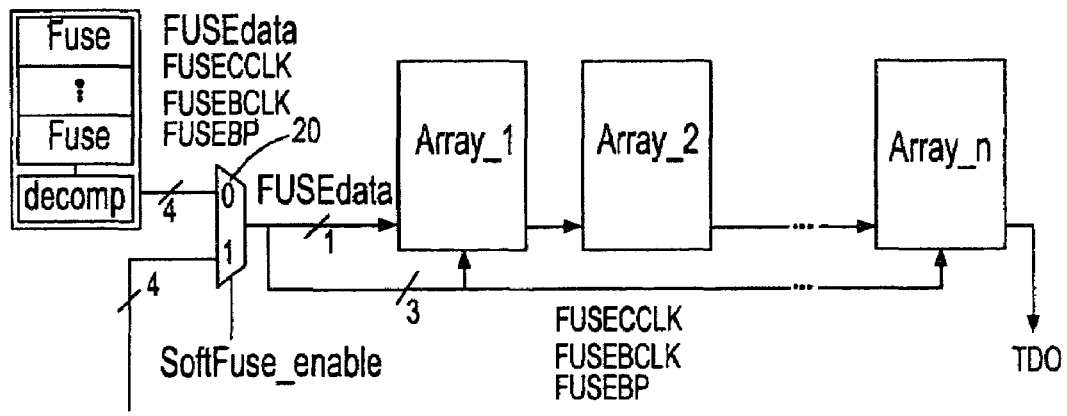
FIG. 2 is a block diagram of a portion of an integrated circuit and illustrating principals of this invention.

With reference to FIG. 2, Array_1 through Array_n represents a set of one or more redundant memory arrays on the integrated circuit. For example, as disclosed in U.S. Pat. No. 6,577,156, the redundancy circuits inside each array are preferably controlled by decompressed fuse data that, in response to a specific signal (for example, initiated at Power-On), are transferred from the Fuse Box into a set of "fuse latches" in each array. Per array, these "fuse latches", implemented as L1-L2 (master-slave) latches, are arranged as a shift register, forming a serial scan chain. The output of this "fuse scan chain" of one array connects to the input of the fuse scan chain of the next array, so that effectively the individual fuse scan chains per array are concatenated into one single long scan chain.

The Fuse Box is also preferably implemented as per the teachings of U.S. Pat. No. 6,577,156. The outputs of the Fuse Box are as follows:

FUSEdata is a single signal that carries the decompressed fuse data from the Fuse Box to the arrays, and from one array to the next array, in a serial scan chain fashion.

FUSECCLK is the capture clock signal that admits a FUSE data value into the L1 (master) latches of the redundancy circuits inside the memory arrays.

FUSEBCLK is the clock signal that admits a Fusedata value from an L1 (master) latch to the corresponding L2 (slave) latch, thereby presenting the Fusedata value at the L2 output of the L1-L2 master-slave latch pair. The L2 output is connected to the L1 input of the next latch in the serial fuse scan chain.

FUSEBP (Fuse Bypass) is a signal that controls the Fuse scan chain in each array. During a fuse initialization phase it allows the fuse scan chain to be operated. Once fuse initialization is completed, FUSEBP switches state so that the decompressed data, that has completed transfer into the arrays, is protected from further scan operations.

Preferably, consistent with the description in U.S. Pat. No. 6,577,156, the operation of the circuitry is as follows:

In response to a specific signal, for example at Power-on, the integrated circuit enters into a fuse initialization phase.

At the beginning of the fuse initialization phase, the Fuse Box switches the state of the FUSEBP signal from an inoperative state to an operative state, so as to allow operation of the fuse scan chains in the arrays. In FIG. 2, the operational value would be a '0'.

Fuse data is read and decompressed in the Fuse Box.

The decompressed data is transferred via the Fusedata signal to the arrays using a serial scan chain operation, employing a sequence of non-overlapping clock pulses of FUSECCLK and FUSEBCLK. With each pair of FUSECCLK and FUSEBCLK pulses, the Fusedata values shift one stage (L1-L2 latch pair) down the serial fuse scan chain, until all redundancy controlling latches in all arrays are set.

After the serial scan operation completes, the Fuse Box switches the state of the FUSEBP signal back to the inoperative state, called the "bypass state", so that further scan clock activity on the serial fuse scan chain will not disturb the decompressed fuse information that is now resident in the arrays. In the example of FIG. 2, FUSEBP would assume the value '1' to go to this "bypass state".

This ends the activity of the fuse initialization phase. The Fuse Box enters an inactive state.

In the arrays, the decompressed fuse information now controls the redundancy logic of the arrays, substituting redundant elements for elements that were determined to be faulty at the time of manufacturing test and fuse blow.

The present invention elaborates on this schema by providing additional features to enable modification of the original redundancy information, which, in turn, allows unused redundancy elements to be substituted for newly failing array elements.

More specifically, the new features provided by the preferred embodiment of the present invention include the insertion of a 2:1 muliplexer 20 between the Fuse Box and the first array of the serial full scan chain, and the use of an additional signal, referred to as SoftFuse_enable, which is used as the select signal of the multiplexer. In the preferred embodiment of the invention, the SoftFuse_enable signal is under the control of a specific IEEE1149.1 instruction (either a Public or Private Instruction, as defined in IEEE Standard 1149.1a-1993, *"IEEE Standard Test Access Port and Boundary-Scan Architecture"*, IEEE, New York, 1993). This description is referred to herein as "SoftFuse".

Optionally, more elaborate controls can be put on SoftFuse_enable, to safeguard against accidental operation, and/or to ensure compatibility with manufacturing test requirements.

When the SoftFuse_enable signal is asserted, the multiplexer preferably allows the following actions to happen:

The FUSEBP signal driven to the arrays is replaced by a logical '0'. This takes the arrays out of the Bypass state and enables the operation of the array fuse scan chains.

The FUSEdata signal driven to the first array is replaced by a signal driven from the primary TDI input, preferably, as defined in the IEEE1149.1 standard.

The FUSECCLK driven to the arrays is replaced by a signal, JTAG_ShiftClk in FIG. 2, which, for example, is a pulse derived from the rising edge of the TCK clock in the Shift-DR state, as defined in the IEEE1149.1 standard. JTAG_ShiftClk is only active when the SoftFuse instruction is active.

The FUSEBCLK driven to the arrays is replaced by a signal, JTAG_L2Clk in FIG. 2, which, for example, is a pulse derived from the falling edge of the TCK clock as defined in the IEEE1449.1 standard.

Whenever the SoftFuse_enable signal is asserted, the FUSEdata output of the last array in the serial fuse scan chain is routed to the TDO output, for example, as defined in the above-identified IEEE Standard 1149.1a-1993. Any suitable procedure may be used to route this FUSEdata output of the last array to the TDO output.

With these features in place, the preferred operation of the circuitry is as follows.

In terms of the IEEE1149.1 standard IEEE Standard 1149.1a-1993 a specific "SoftFuse" instruction is entered into the test controller using a Shift-IR operation. At Update-IR, this instruction is decoded with the effect that the SoftFuse_enable signal is asserted; activating the 2:1 multiplexer as described above and thereby placing the fuse scan chain inside the arrays under control of the IEEE1149.1 signals.

In a subsequent Shift-DR sequence, the data on the primary chip input TDI is sampled at the first L1 latch of the first array in the chain at each rising edge of TCK, and shifted into the corresponding L2 latch on the next falling edge of TCK. In this manner, successive values of TDI are shifted into the fuse scan chains though the arrays. Simultaneously, the original fuse values resident in the arrays are shifted out of TDO output for capture in an external device.

Thus, effectively, the Fuse scan chain operation has been taken over by the IEEE1149.1 operation as if the fuse scan chain were a Test Data Register (TDR) as defined in IEEE Standard 1149.1a-1993. This allows the fuse data, as resident in the arrays, to be read, modified if necessary, and rewritten.

Consequently, if a memory test finds a failure in one of the memory arrays, and if the failure diagnostics points to a specific element for which the array has a redundant element available, then this invention allows the fuse information for that particular array to be modified, by switching-in the redundant element for the failed element, thereby repairing the failures. This can happen at any time after manufacturing. Thereby this invention provides a failure repair facility in the case that a new array failure emerges after the integrated circuit has been operating in a system for a length of time.

While it is apparent that the invention herein disclosed is well calculated to fulfill the objects stated above, it will be appreciated that numerous modifications and embodiments may be devised by those skilled in the art and it is intended that the appended claims cover all such modifications and embodiments as fall within the true spirit and scope of the present invention.

What is claimed is:

1. A method of repairing an integrated circuit, the circuit including a set of memory arrays, a fuse box holding control data to control redundancy logic of the arrays, and a selector for transmitting the control data to the memory arrays, the method comprising the steps:
   at a first time period, transmitting the control data from the fuse box, through the selector and to the memory arrays to control the redundancy logic of the arrays;
   at a second time period, transmitting alternate control data from an alternate source, external to the integrated circuit, through the selector and to the memory arrays to control the redundancy logic of the arrays; and
   applying a selector enable signal having first and second states to the selector, including the steps of
   at said first time period, applying the selector enable signal in the first state thereof, to the selector to enable the selector to pass the control data from the fuse box to the memory arrays, and
   at said second time period, applying the selector enable signal in the second state thereof, to the selector to enable the selector to pass the alternate control data from the alternate source and to the memory arrays.

2. A method according to claim 1, wherein:
   said first time period is during a manufacturing test; and
   said second time period is during an in-the-field test.

3. A method according to claim 1, wherein the selector is a multiplexer having first and second data inputs and a control input, and wherein:
   the step of transmitting the control data includes the step of applying the control data from the fuse box to the first data input of the multiplexer;
   the step of transmitting the alternate control data includes the step of applying the alternate control data to the second data input of the multiplexer; and
   the step of applying the selector enable signal includes the step of applying the selector enable signal to the control input of the multiplexer.

4. A method according to claim 1, wherein the step of transmitting the alternate control data to the memory arrays includes the step of replacing the control data in the memory arrays from the fuse box with the alternate control data.

5. A method according to claim 1, wherein the memory arrays are arranged in a serial sequence, and the step of transmitting the alternate control data to the memory arrays includes the step of transmitting the alternate control data through the memory arrays, one memory array at a time, in the order of said sequence.

6. A method according to claim 1 wherein the memory arrays are arranged in multiple serial sequences, driven by one or more fuse boxes, and wherein each such serial sequence has a separate and independently controlled control data selector inserted between the fuse box and the first memory array in that sequence.

* * * * *